(12) United States Patent
Tomita et al.

(10) Patent No.: US 8,902,007 B2
(45) Date of Patent: Dec. 2, 2014

(54) CLOCK DISTRIBUTOR AND ELECTRONIC DEVICE

(71) Applicant: Fujitsu Limited, Kawasaki (JP)

(72) Inventors: Yasumoto Tomita, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 95 days.

(21) Appl. No.: 13/706,931

(22) Filed: Dec. 6, 2012

(65) Prior Publication Data

US 2013/0194047 A1    Aug. 1, 2013

(30) Foreign Application Priority Data

Jan. 26, 2012    (JP) ................ 2012-014224

(51) Int. Cl.
| | |
|---|---|
| H03L 7/00 | (2006.01) |
| H03L 7/08 | (2006.01) |
| H03L 7/099 | (2006.01) |
| H03K 3/03 | (2006.01) |
| G06F 1/10 | (2006.01) |

(52) U.S. Cl.
CPC ................ H03L 7/00 (2013.01); H03L 7/0805 (2013.01); H03L 7/0995 (2013.01); H03K 3/0322 (2013.01); H03L 7/099 (2013.01); G06F 1/10 (2013.01)
USPC ........ 331/2; 331/47; 331/55; 331/56; 331/74; 331/172; 331/179; 327/144; 327/296; 327/297

(58) Field of Classification Search
USPC .......... 327/144, 291–297, 563; 331/2, 46, 47, 331/49, 55–57, 74, 172, 173, 179
See application file for complete search history.

(56) References Cited

U.S. PATENT DOCUMENTS

| | | | | |
|---|---|---|---|---|
| 5,357,217 | A * | 10/1994 | Marchesi et al. | 331/57 |
| 5,475,344 | A * | 12/1995 | Maneatis et al. | 331/57 |
| 6,617,936 | B2 * | 9/2003 | Dally et al. | 331/57 |
| 6,683,503 | B2 | 1/2004 | Mizuno et al. | |
| 7,155,188 | B2 * | 12/2006 | Noboru et al. | 455/255 |
| 7,336,135 | B2 * | 2/2008 | Higashi et al. | 331/108 B |
| 7,863,987 | B2 | 1/2011 | Kanda et al. | |
| 8,258,882 | B2 * | 9/2012 | Shibasaki et al. | 331/55 |

FOREIGN PATENT DOCUMENTS

| | | |
|---|---|---|
| JP | 11-74762 | 3/1999 |
| JP | 2007-82158 | 3/2007 |

\* cited by examiner

*Primary Examiner* — Levi Gannon
(74) *Attorney, Agent, or Firm* — Fujitsu Patent Center

(57) ABSTRACT

A clock distributor includes unit circuit parts each including an oscillator, a first element configured to convert output voltage of the oscillator into a current, a second element having a voltage current conversion characteristic of an opposite phase to that of the first element, the second element being feedback connected to the first element and the oscillator, a third element configured to convert output voltage of the oscillator into a current, a fourth element having a voltage current conversion characteristic of an opposite phase to that of the third element, the fourth element being feedback connected to the third element and the oscillator; a wiring part to connect a connection part of the first and second elements of a unit circuit part to a connection part of the third and fourth elements of another unit circuit part; and a synchronization circuit connected to the oscillator of a unit circuit part.

15 Claims, 8 Drawing Sheets

CLOCK DISTRIBUTOR AND ELECTRONIC DEVICE

CROSS-REFERENCE TO RELATED APPLICATION

This patent application is based upon and claims the benefit of priority of the prior Japanese Patent Application No. 2012-014224 filed on Jan. 26, 2012, the entire contents of which are incorporated herein by reference.

FIELD

The embodiments discussed herein are related to a clock distributor and an electronic device.

BACKGROUND

Conventionally, there is a clock signal generation/distribution device including a plurality of first LC resonance oscillators for respectively supplying clocks to a plurality of circuit blocks via buffers, a second LC resonance oscillator having the same physical configuration as the plurality of first LC resonance oscillators, a frequency distributor connected to a feedback loop of the second LC resonance oscillator, a phase comparator, a charge pump, and a low-pass filter. Resistance elements are inserted between the respective oscillating nodes of the plurality of first LC resonance oscillators and the second LC resonance oscillator.

Furthermore, there is an oscillator including at least two ring oscillating circuits in which plural inverters are connected in a multistage ring shape, and conductive wirings. The output of at least one inverter in all of the ring oscillating circuits is connected to the conductive wirings.

Patent document 1: Japanese Laid-Open Patent Publication No. 2007-082158

Patent document 2: Japanese Laid-Open Patent Publication No. H11-074762

In the case of an LC oscillator using an inductor, there is a problem that the area of the inductor is large, and a problem that oscillating is only possible in a small frequency range because LC oscillation is performed.

Furthermore, in a conventional oscillator, the output of at least one inverter in all of the ring oscillating circuits is directly connected via the conductive wirings. Therefore, the load of the ring oscillating circuit increases, and oscillation at a high frequency is difficult.

As described above, in a conventional clock signal generation/distribution device and in a conventional oscillator, the oscillating nodes are directly connected to each other. Therefore, there are cases where the load at the oscillating node increases, and oscillation at high frequencies is difficult.

SUMMARY

According to an aspect of the embodiments, a clock distributor includes a plurality of unit circuit parts, each of the plurality of unit circuit parts including an oscillator, a first voltage current converting element configured to convert output voltage of the oscillator into a current, a second voltage current converting element having a voltage current conversion characteristic of an opposite phase to that of the first voltage current converting element, the second voltage current converting element being feedback connected to the first voltage current converting element and the oscillator, a third voltage current converting element configured to convert output voltage of the oscillator into a current, a fourth voltage current converting element having a voltage current conversion characteristic of an opposite phase to that of the third voltage current converting element, the fourth voltage current converting element being feedback connected to the third voltage current converting element and the oscillator; a wiring part configured to connect a first connection part of the first voltage current converting element and the second voltage current converting element of one of the plurality of unit circuit parts to a second connection part of the third voltage current converting element and the fourth voltage current converting element of another one of the plurality of unit circuit parts; and a synchronization circuit connected to the oscillator of one of the plurality of unit circuit parts.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

A clock distributor and an electronic device according to an embodiment of the present invention are described below.

Figure 1:
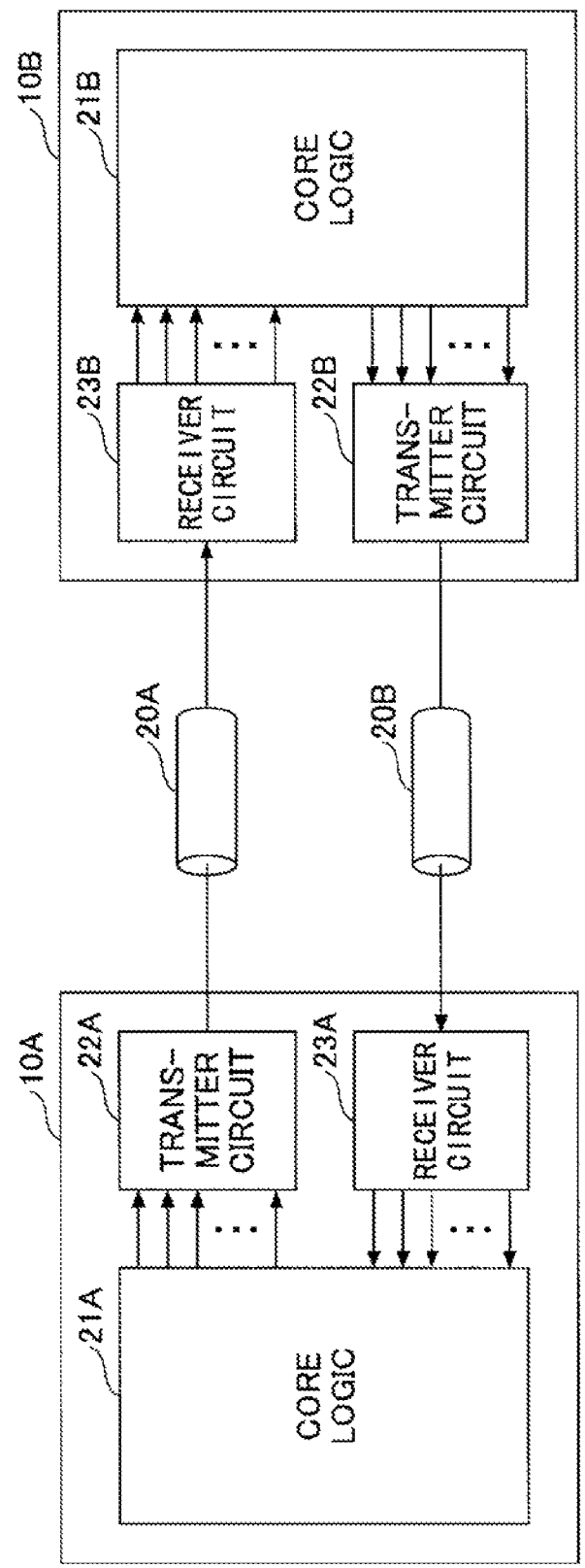
FIG. 1 illustrates an IC chip including a clock distributor according to a first embodiment.

FIG. 1 illustrates an IC chip including a clock distributor according to a first embodiment.

IC (Integrated Circuit) chips 10A and 10B are connected to each other via transmission paths 20A and 20B.

Each of the IC chips 10A and 10B is constituted by, for example, a LSI (Large Scale Integrated circuit). For example, the transmission paths 20A and 20B are formed by schematically expressing wirings of back planes on which the IC chips 10A and 10B are mounted.

The IC chip 10A includes a core logic 21A, a transmitter circuit 22A, and a receiver circuit 23A. Similarly, the IC chip 10B includes a core logic 21B, a transmitter circuit 22B, and a receiver circuit 23B.

The clock distributor according to the first embodiment is included in, for example, the transmitter circuit 22A, the receiver circuit 23A, the transmitter circuit 22B, and the receiver circuit 23B.

The transmitter circuit 22A, the receiver circuit 23A, the transmitter circuit 22B, the receiver circuit 23B, and the IC chips 10A and 10B are examples of electronic devices including the clock distributor according to the first embodiment.

The core logics 21A and 21B are cores that respectively include a CPU (Central Processing Unit).

The transmitter circuit 22A has an input side connected to the core logic 21A and an output side connected to the receiver circuit 23B of the IC chip 10B via the transmission path 20A. The receiver circuit 23A has an output side connected to the core logic 21A and an input side connected to the transmitter circuit 22B of the IC chip 10B via the transmission path 20B.

The transmitter circuit 22B has an input side connected to the core logic 21B and an output side connected to the receiver circuit 23A of the IC chip 10A via the transmission path 20B. The receiver circuit 23B has an output side connected to the core logic 21B and an input side connected to the transmitter circuit 22A of the IC chip 10A via the transmission path 20A.

In cases of transmitting data between the IC chips 10A and 10B via the transmission paths 20A and 20B such as back planes, clock signals in synchronization with the transmission data are needed.

Thus, the IC chips 10A and 10B according to the first embodiment include clock distributors for dividing clocks, provided inside the transmitter circuit 22A, the receiver circuit 23A, the transmitter circuit 22B, and the receiver circuit 23B that transmit and receive data.

Figure 2:
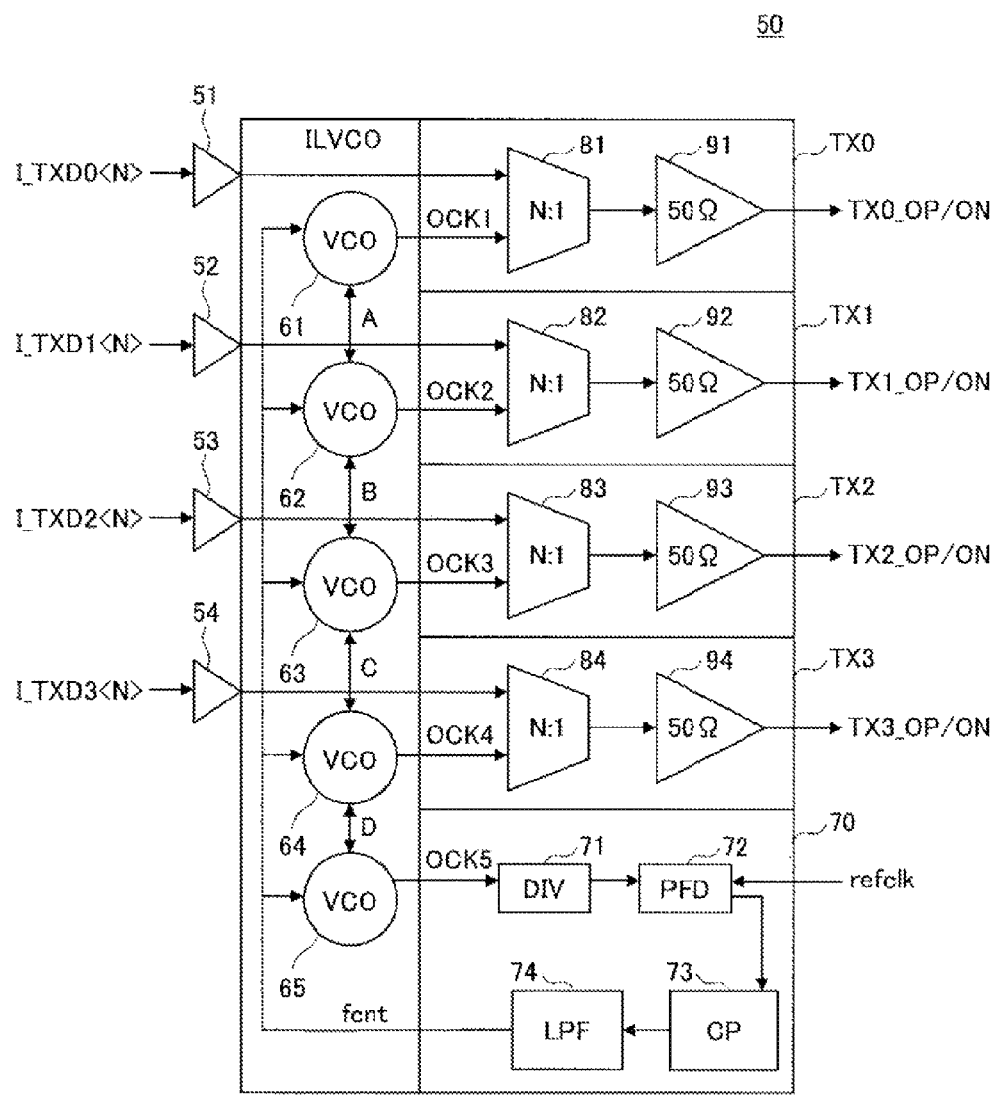
FIG. 2 illustrates a multi-channel type transmitter circuit including the clock distributor according to the first embodiment.

FIG. 2 illustrates a multi-channel type transmitter circuit 50 including the clock distributor according to the first embodiment.

The transmitter circuit 50 includes buffers 51 through 54, VCO (Voltage Controlled Oscillator) 61 through 65, transmission units TX0, TX1, TX2, and TX3, and a synchronization circuit 70. Among the elements included in the transmitter circuit 50, the VCO 61 through 65 and the synchronization circuit 70 constitute a clock distributor.

The buffers 51 through 54 are circuit elements for inputting input data I_TXD0<N> through I_TXD3<N> to the transmission units TX0, TX1, TX2, and TX3 of the transmitter circuit 50. For example, when the transmitter circuit 50 is used as the transmitter circuit 22A illustrated in FIG. 1, data to be transmitted from the core logic 21A to the IC chip 10B is input to the buffers 51 through 54. Similarly, when the transmitter circuit 50 is used as the transmitter circuit 22B illustrated in FIG. 1, data to be transmitted from the core logic 21B to the IC chip 10A is input to the buffers 51 through 54.

The VCO 61 through 65 are voltage control type oscillators.

The VCO 61 through 64 respectively input clocks OCK 1 through OCK 4 to multiplexers 81 through 84 of the transmission units TX0, TX1, TX2, and TX3.

Furthermore, the VCO 65 is inserted in the loop of the synchronization circuit 70, and constitutes a PLL (Phase Locked Loop) circuit together with a DIV (frequency divider) 71, a PFD (Phase Frequency Detector) 72, a CP (Charge Pump) 73, and a LPF (Low Pass Filter) 74 of the synchronization circuit 70.

The transmission units TX0, TX1, TX2, and TX3 respectively include the multiplexers 81 through 84 and buffers 91 through 94. The transmission units TX0, TX1, TX2, and TX3 respectively convert the input data I_TXD0<N> through I_TXD3<N>, input to the buffers 51 through 54, into serial data from parallel data with the multiplexers 81 through 84, based on the clocks OCK 1 through OCK 4 oscillated by the VCO 61 through 64. Then, the transmission units TX0, TX1, TX2, and TX3 respectively send transmission data TX0_OP/ON through TX3_OP/ON from the buffers 91 through 94.

The synchronization circuit 70 includes the DIV 71, the PFD 72, the CP 73, and the LPF 74, and constitutes a PLL circuit together with the VCO 65.

The DIV 71 is a frequency divider, and is connected between the VCO 65 and the PFD 72. The DIV 71 divides the input clock by N (N being an integer), and generates a clock for comparing with a reference clock refclk, and outputs the generated clock.

The PFD 72 detects the phase difference between the clock input from the DIV 71 and the reference clock refclk, and outputs an error signal (analog signal) according to the phase difference.

The CP 73 converts the analog error signals output from the PFD 72 into electric current error signals.

The LPF 74 integrates the electric current error signals input from the CP 73, and outputs phase adjustment signals fcnt for adjusting the phase of the VCO 65.

The VCO 61 through 65 are connected to each other as indicated by arrows A through D, and the phase adjustment signals fcnt output from the LPF 74 of the synchronization circuit 70 are input to the VCO 61 through 64.

Accordingly, the VCO 61 through 65 perform mutual injection locking.

Operations according to the connection relationship and mutual injection locking of the VCO 61 through 65 are described below.

Figure 3:
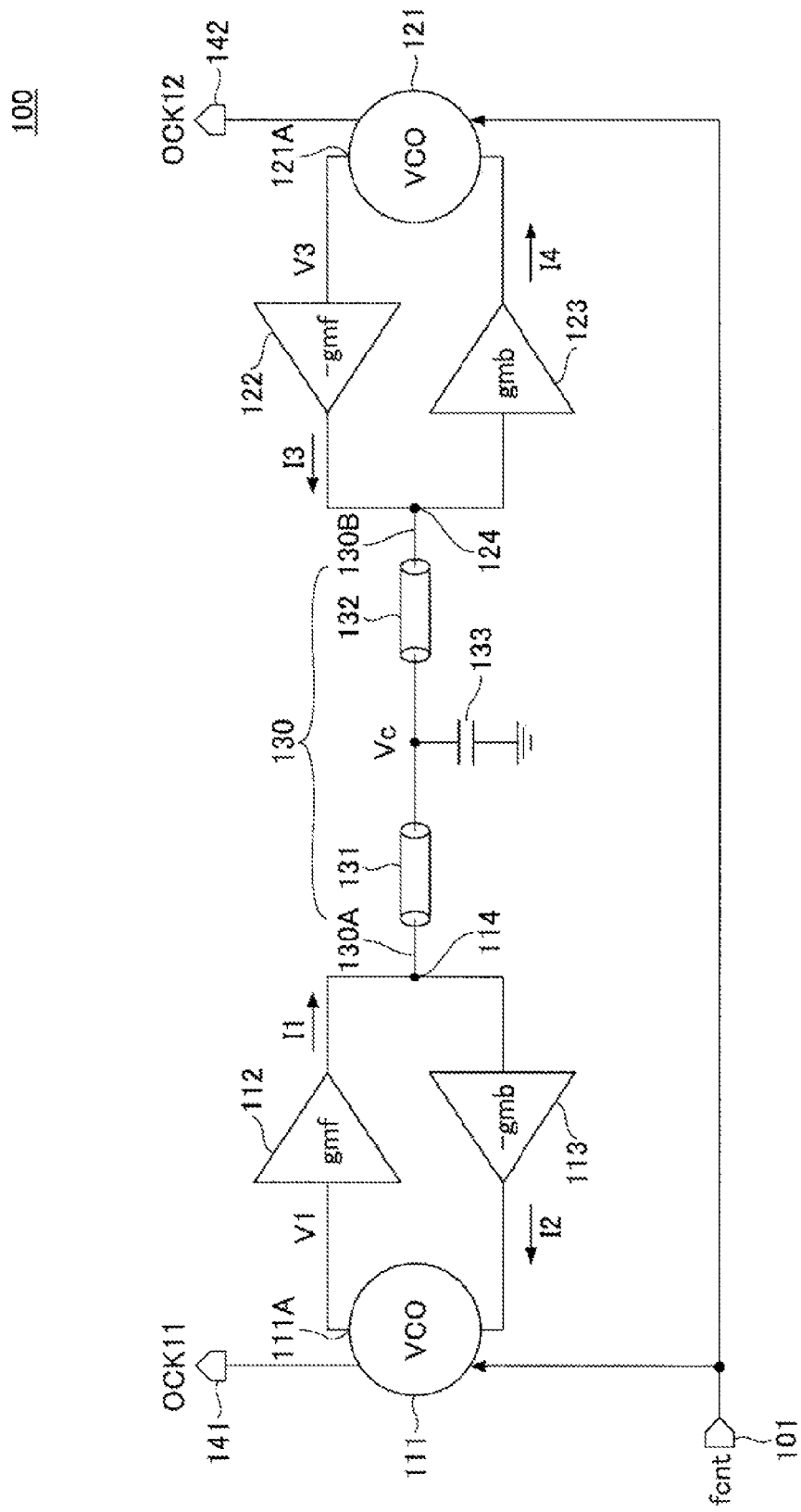
FIG. 3 illustrates a clock distributor according to the first embodiment.

FIG. 3 illustrates a clock distributor 100 according to the first embodiment.

The clock distributor 100 includes a phase adjustment signal input terminal 101, VCO 111, 121, GM elements 112, 113, 122, and 123, wirings 130, and output terminals 141, 142.

In FIG. 3, the clock distributor 100 includes two VCO 111, 121 so that the operations according to the connection relationship and mutual injection locking of the VCO are easily understood, and the synchronization circuit 70 of FIG. 2 is not illustrated. The association between the clock distributor 100 illustrated in FIG. 3 and the transmitter circuit 50 illustrated in FIG. 2 is described below.

The VCO 111 corresponds to any one of the VCO 61 through 64 illustrated in FIG. 2. Therefore, the VCO 111 is connected to a transmission unit similar to any one of the transmission units TX0, TX1, TX2, and TX3, and inputs clocks OCK 11.

Furthermore, the VCO 121 corresponds to the VCO 65 illustrated in FIG. 2, and constitutes the PLL circuit together with the synchronization circuit 70. Therefore, the VCO 121 inputs clocks OCK 12 in a synchronization circuit similar to the synchronization circuit 70.

Furthermore, the GM elements 112, 113, 122, and 123 and the wirings 130 illustrated in FIG. 3 indicate the connection relationship between the VCO 111 and the VCO 121, which correspond to the connection relationship between the VCO 61 through 65 indicated by the arrows A through D in FIG. 2.

As illustrated in FIG. 3, an oscillation node 111A of the VCO 111 is connected to a terminal 130A of the wirings 130 via the GM element 112, and the GM element 113 is feedback connected to the VCO 111 and the GM element 112. To a connection point 114 of the GM elements 112 and 113, the terminal 130A of the wirings 130 is connected. The VCO 111 is an example of a first oscillator.

The GM element 112 includes a transconductance gmf, which converts clocks output from the oscillation node 111A of the VCO 111 into a current I1 (from voltage V1), and outputs the current I1. The GM element 112 is an example of a first voltage current converting element.

The GM element 113 includes a transconductance (-gmb), which converts the voltage at the connection point 114 into a current I2, and feeds back the current I2 to the VCO 111. The GM element 113 is an example of a second voltage current converting element.

An oscillation node 121A of the VCO 121 is connected to another terminal 130B of the wirings 130 via the GM element 122, and the GM element 123 is feedback connected to the VCO 121 and the GM element 122. To a connection point 124 of the GM elements 122 and 123, the other terminal 130B of the wirings 130 is connected. The VCO 121 is an example of a second oscillator connected to the synchronization circuit.

The GM element 122 includes a transconductance (-gmf), and converts clocks output from the oscillation node 121A of the VCO 121 into the current I3 (from voltage V3), and outputs the current I3. The GM element 122 is an example of a third voltage current converting element.

The GM element 123 includes a transconductance gmb, and converts the voltage at the connection point 124 into a current I4, and feeds back the current I4 to the VCO 121. The GM element 123 is an example of a fourth voltage current converting element.

The wirings 130 have the terminal 130A connected to the connection point 114 of the GM elements 112 and 113, and the other terminal 130B connected to the connection point 124 of the GM elements 122 and 123. The wirings 130 are constituted by wirings inside the LSI.

In FIG. 3, in order to schematically illustrate the wirings 130 and the parasitic capacitance of the wirings 130, wiring parts 131 and 132 and a capacitor 133 are illustrated.

The transconductance of the GM element 112 and the transconductance of the GM element 122 have opposite phases, and therefore at the wirings 130, a voltage Vc according to the difference (I1-I3) in the output current of the GM elements 112 and 122 is generated. In the clock distributor 100 according to the first embodiment, by making the GM elements 112 and 122 have a transconductance of opposite phases and connecting these elements with the wirings 130, subtraction between the output current I1 of the GM element 112 and the output current I3 of the GM element 122 is implemented.

Therefore, the GM elements 113 and 123 respectively convert the voltage Vc into currents I2 and I4, and feed back these currents to the VCO 111, 121. The GM elements 113 and 123 both convert the voltage Vc into a current, and therefore the current values of the currents I2 and I4 are equal.

Therefore, it is possible to feed back equal currents to the VCO 111 and 121.

In the clock distributor 100 illustrated in FIG. 3, phase adjustment signals fcnt are input from the LPF of the synchronization circuit to the phase adjustment signal input terminal 101 to lock the VCO 121. Accordingly, it is possible to feed back equal electric currents to the VCO 111 and the VCO 121, and mutual injection locking is performed at the VCO 111 and the VCO 121. Accordingly, the frequencies of the clocks OCK 11 and the clocks OCK 12 respectively oscillated by the VCO 111 and the VCO 121 become equal.

Next, with reference to FIG. 4, a detailed description of the circuit of the clock distributor 100 according to the first embodiment is given below.

Figure 4:
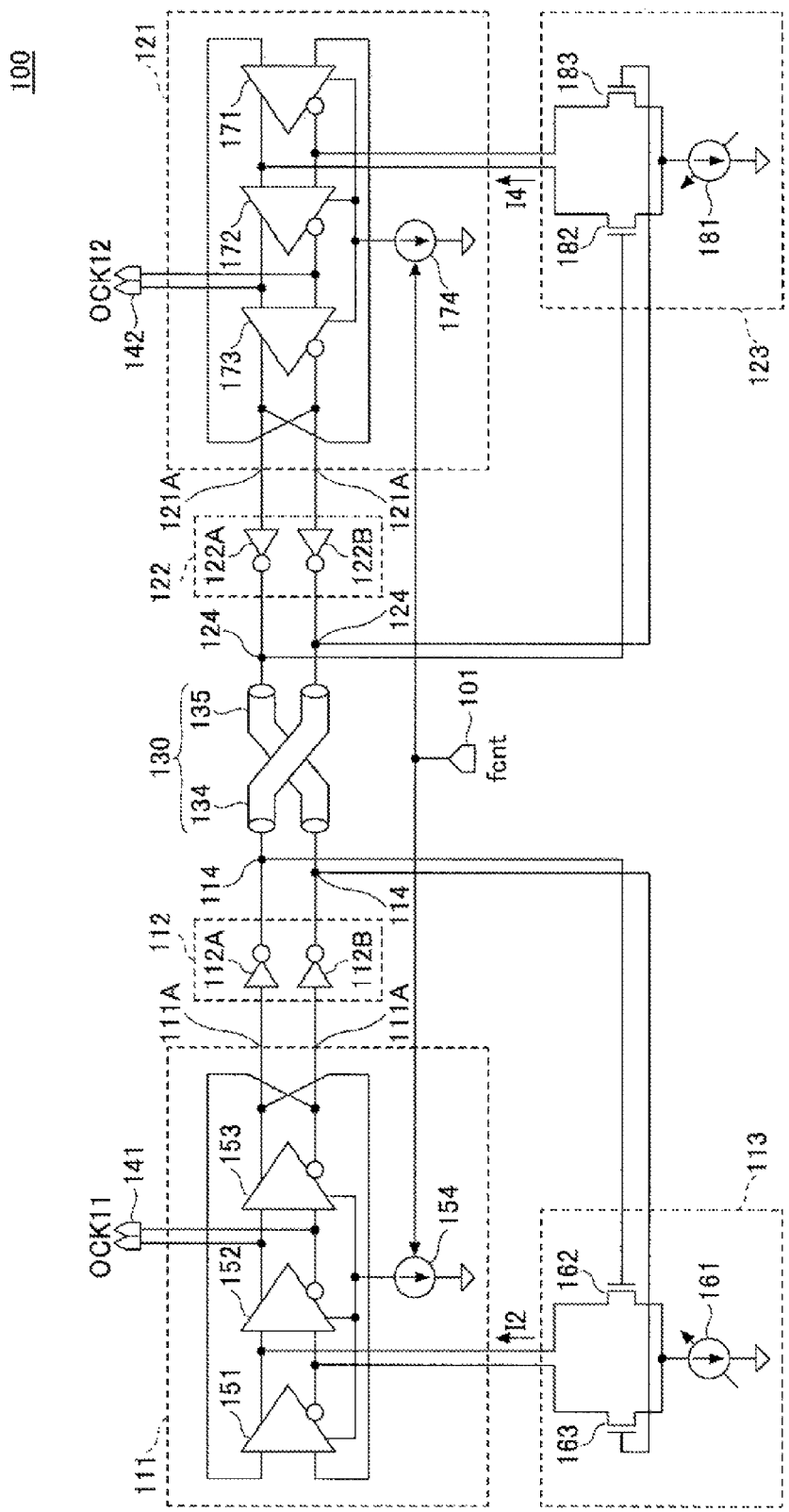
FIG. 4 illustrates a circuit configuration of the clock distributor according to the first embodiment.

FIG. 4 illustrates a circuit configuration of the clock distributor 100 according to the first embodiment. In FIG. 4, it is assumed that the VCO 111 and the VCO 121 both output differential clocks.

The VCO 111 includes three stages of inverters 151, 152, and 153 and an electric current source 154. The inverters 151, 152, and 153 are current starved type inverters, and constitute a ring oscillator. The VCO 111 is one type of a ring oscillator.

That is to say, the inverters 151, 152, and 153 are connected in series, and the non-inverting output terminal of the inverter 153 is connected to the inverting output terminal of the inverter 151 (bottom input terminal in FIG. 4). Furthermore, the inverting output terminal of the inverter 153 is connected to the non-inverting output terminal of the inverter 151 (top input terminal in FIG. 4).

For example, the inverters 151, 152, and 153 are implemented by CMOS (Complementary Metal Oxide Semiconductor).

The oscillation frequency of the VCO 111 is controlled by adjusting the output current value of the electric current source 154 with phase adjustment signals fcnt input to the phase adjustment signal input terminal 101.

The clocks OCK 11 output from the VCO 111 may be acquired from any of the output terminals of the inverters 151, 152, and 153 constituting the ring oscillator. In FIG. 4, as one example, the output from the inverter 152 is acquired as the output of the VCO 111. From the output terminal 141, the differential type clocks OCK 11 are output.

The input destination of the current I2 fed back from the GM element 113 may be any of the input terminals of the inverters 151, 152, and 153 constituting the ring oscillator. In FIG. 4, the current I2 is input to the input terminal of the inverter 152.

The GM element 112 may be an element that performs current conversion on the output of the VCO 111. In FIG. 4, inverters 112A and 112B are used. The inverters 112A and 112B both have a transconductance of gmf.

The output terminal of the inverter 112A is connected to the GM element 113, and is connected to an inverter 122B of the GM element 122 via wirings 134 included in the wirings 130. To the inverter 112A, the non-inverting output terminal of the inverter 153 of the VCO 111 is connected, and to the inverter 122B, the inverting output terminal of the inverter 173 of the VCO 121 is connected.

Thus, in a track part 134, a voltage is generated according to the difference between the output currents of the inverters 112A and 122B.

The output terminal of the inverter 112B is connected to the GM element 113, and is connected to an inverter 122A of the GM element 122 via wirings 135 included in the wirings 130. To the inverter 112B, the inverting output terminal of the inverter 153 of the VCO 111 is connected, and to the inverter 122A, the non-inverting output terminal of the inverter 173 of the VCO 121 is connected.

Thus, in a track part 135, a voltage is generated according to the difference between the output currents of the inverters 112B and 122A.

The GM element 113 includes an electric current source 161 and two NMOS (N-type Metal Oxide Semiconductor) transistors 162, 163.

The electric current source 161 has one terminal (top terminal in FIG. 4) connected to the sources of the NMOS transistors 162, 163, and another terminal (bottom terminal in FIG. 4) connected to ground.

The NMOS transistor 162 has a source connected to the source of the NMOS transistor 163 and the electric current source 161. The NMOS transistor 162 has a drain connected between the non-inverting output terminal of the inverter 151 and the non-inverting output terminal of the inverter 152.

The NMOS transistor 163 has a source connected to the source of the NMOS transistor 162 and the electric current source 161. The NMOS transistor 163 has a drain connected between the inverting output terminal of the inverter 151 and the inverting output terminal of the inverter 152.

The VCO 121 includes three stages of inverters 171, 172, and 173 and an electric current source 174. The inverters 171, 172, and 173 are current starved type inverters, and constitute a ring oscillator. The VCO 121 is one type of a ring oscillator.

That is to say, the inverters 171, 172, and 173 are connected in series, and the non-inverting output terminal of the inverter 173 is connected to the inverting output terminal of the inverter 171 (bottom input terminal in FIG. 4). Furthermore, the inverting output terminal of the inverter 173 is connected to the non-inverting output terminal of the inverter 171 (top input terminal in FIG. 4).

For example, the inverters 171, 172, and 173 are implemented by CMOS.

The oscillation frequency of the VCO 121 is controlled by adjusting the output current value of the electric current source 174 with phase adjustment signals fcnt input to the phase adjustment signal input terminal 101.

The clocks OCK 12 output from the VCO 121 may be acquired from any of the output terminals of the inverters 171, 172, and 173 constituting the ring oscillator. In FIG. 4, as one example, the output from the inverter 172 is acquired as the output of the VCO 121. From the output terminal 142, the differential type clocks OCK 12 are output.

The input destination of the current I4 fed back from the GM element 123 may be any of the input terminals of the inverters 171, 172, and 173 constituting the ring oscillator. In FIG. 4, the current I4 is input to the input terminal of the inverter 172.

The GM element 122 may be an element that performs current conversion on the output of the VCO 121. In FIG. 4, inverters 122A and 122B are used. The inverters 122A and 122B both have a transconductance of gmf.

The output terminal of the inverter 122A is connected to the GM element 123, and is connected to the inverter 112B of the GM element 112 via wirings 135 included in the wirings 130. To the inverter 122A, the non-inverting output terminal of the inverter 173 of the VCO 121 is connected, and to the inverter 112B, the inverting output terminal of the inverter 153 of the VCO 111 is connected.

Thus, in the track part 135, a voltage is generated according to the difference between the output currents of the inverters 122A and 112B.

The output terminal of the inverter 122B is connected to the GM element 123, and is connected to the inverter 112A of the GM element 112 via wirings 134 included in the wirings 130. To the inverter 122B, the inverting output terminal of the inverter 173 of the VCO 121 is connected, and to the inverter 112A, the non-inverting output terminal of the inverter 153 of the VCO 111 is connected.

Thus, in the track part 134, a voltage is generated according to the difference between the output currents of the inverters 122B and 112A.

The GM element 123 includes an electric current source 181 and two NMOS (N-type Metal Oxide Semiconductor) transistors 182, 183.

The electric current source 181 has one terminal (top terminal in FIG. 4) connected to the sources of the NMOS transistors 182, 183, and another terminal (bottom terminal in FIG. 4) connected to ground.

The NMOS transistor 182 has a source connected to the source of the NMOS transistor 183 and the electric current source 181. The NMOS transistor 182 has a drain connected between the non-inverting output terminal of the inverter 171 and the non-inverting output terminal of the inverter 172.

The NMOS transistor 183 has a source connected to the source of the NMOS transistor 182 and the electric current source 181. The NMOS transistor 183 has a drain connected between the inverting output terminal of the inverter 171 and the inverting output terminal of the inverter 172.

In the clock distributor 100 according to the first embodiment as described above, in the track part 134, a voltage is generated according to the difference between the output currents of the inverters 112A and 122B. In the track part 135, a voltage is generated according to the difference between the output currents of the inverters 112B and 122A.

Thus, the electric current source 161 of the GM element 113 and the electric current source 181 of the GM element 123 are driven by a voltage according to the difference between the same output currents. The voltage according to the difference between the output currents generated at the track part 134 and the track part 135 is the voltage corresponding to a differential signal between an output signal of the oscillation node 111A of the VCO 111 and an output signal of the oscillation node 121A of the VCO 121.

Accordingly, the GM elements 113 and 123 respectively convert the voltages according to the difference in the output currents generated at the track part 134 and the track part 135 into currents I2 and I4, and feed back these currents to the VCO 111, 121. The GM elements 113 and 123 both convert the voltages according to the difference in the output currents generated at the track part 134 and the track part 135 into currents, and therefore the current values of the currents I2 and I4 are equal.

Therefore, it is possible to feed back equal currents to the VCO 111 and 121.

Phase adjustment signals fcnt are input from the LPF of the synchronization circuit to the phase adjustment signal input terminal 101 to lock the VCO 121. Accordingly, it is possible to feed back equal electric currents to the VCO 111 and the VCO 121, and mutual injection locking is performed at the VCO 111 and the VCO 121. Accordingly, the frequencies of the clocks OCK 11 and the clocks OCK 12 respectively oscillated by the VCO 111 and the VCO 121 become equal.

According to the first embodiment, the oscillation nodes of the VCO are not directly connected to each other as in the conventional technology. Instead, the VCO 111 and the VCO 121 are combined so as to obtain a differential signal between an output signal of the oscillation node 111A of the VCO 111 and an output signal of the oscillation node 121A of the VCO 121, via the GM elements 112, 122 and the wirings 130.

That is to say, by making the GM elements 112 and 122 have a transconductance of opposite phases and connecting these elements with the wirings 130, subtraction between the output current I1 of the GM element 112 and the output current I3 of the GM element 122 is implemented.

Furthermore, the current obtained by the subtraction (a current expressing a differential signal between an output signal of the oscillation node 111A of the VCO 111 and an output signal of the oscillation node 121A of the VCO 121) is fed back to the VCO 111 and the VCO 121.

Therefore, the load of the respective oscillation nodes 111A and 121A of the VCO 111 and the VCO 121 is prevented from increasing as in the conventional technology, and oscillation at the same frequency by mutual injection locking is implemented at a higher frequency compared to the conventional technology.

Furthermore, in a conventional clock signal generation/distribution device and a conventional oscillator, the ring oscillating circuits are directly connected to each other, and therefore the load increases and the oscillating range is narrow.

Meanwhile, in the clock distributor 100 according to the first embodiment, the load of the respective oscillation nodes 111A and 121A of the VCO 111 and the VCO 121 is prevented from increasing as in the conventional technology. Therefore, the clock distributor 100 oscillates in a wider range on the high frequency side compared to a conventional clock signal generation/distribution device and a conventional oscillator.

Furthermore, the VCO 111 and the VCO 121 oscillate at the same frequency by mutual injection locking as described above, and therefore the skew of the clocks OCK 11 and the clocks OCK 12 is reduced. Thus, the clock distributor 100 distributes clocks OCK 11 with a reduced skew, from the VCO 121 included in the PLL.

In the above description, the VCO 111 and the VCO 121 respectively include the inverters 151 through 153 and the inverters 171 through 173, of three stages. However, the number of stages of inverters in the VCO 111 and the VCO 121 is not limited to three.

Furthermore, in the above description, the GM elements 112 and 122 respectively include the inverters 112A and 112B and the inverters 122A and 122B. However, the GM elements 112 and 122 may have other circuit configurations, as long as these GM elements are capable of converting the voltage output from the respective oscillation nodes 111A and 121A of the VCO 111 and the VCO 121 into electric currents.

Similarly, the GM elements 113 and 123 may have circuit configurations other than those illustrated in FIG. 4, as long as these GM elements are capable of converting the voltage corresponding to the difference generated at the connection points 114 and 124 into a current, and feeding back the current to the VCO 111 and the VCO 121.

Furthermore, in the above description, the VCO 111 and the VCO 121 are one type of a ring oscillator. However, the VCO 111 and the VCO 121 may be an LC oscillator.

Second Embodiment

Figure 5:
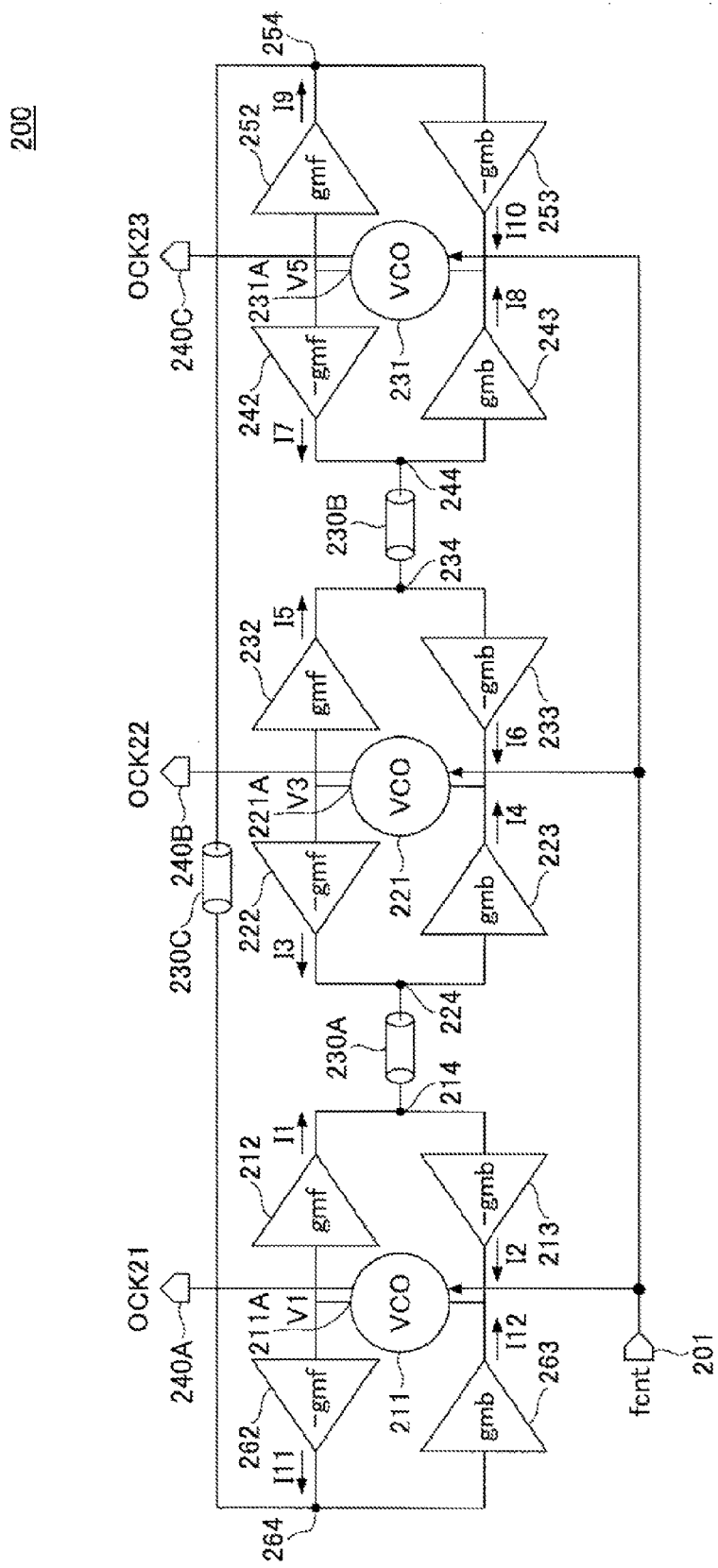
FIG. 5 illustrates a clock distributor according to a second embodiment.

FIG. 5 illustrates a clock distributor 200 according to a second embodiment.

The clock distributor 200 includes a phase adjustment signal input terminal 201, VCO 211, 221, 231, GM elements 212, 213, 222, 223, 232, 233, 242, 243, 252, 253, 262, 263, wirings 230A, 230B, 230C, and output terminals 240A, 240B, 240C.

In FIG. 5, the clock distributor 200 includes three VCO 211, 221, 231, and the synchronization circuit 70 of FIG. 2 is omitted. The association between the clock distributor 200 illustrated in FIG. 5 and the transmitter circuit 50 illustrated in FIG. 2 is described below.

The VCO 211, 221 correspond to two of the VCO 61 through 64 illustrated in FIG. 2. Therefore, the VCO 211, 221 is connected to transmission units similar to two of the transmission units TX0, TX1, TX2, and TX3, and respectively input clocks OCK 21, OCK 22.

The VCO 231 corresponds to the VCO 65 illustrated in FIG. 2, and constitute a PLL circuit together with the synchronization circuit 70. Therefore, the VCO 231 inputs clocks OCK 23 to a synchronization circuit similar to the synchronization circuit 70.

Furthermore, the GM elements 212, 213, 222, 223, 232, 233, 242, 243, 252, 253, 262, 263 and the wirings 230A, 230B, 230C illustrated in FIG. 5 indicate the connection relationship between the VCO 211, 221, 231, which correspond to the connection relationship between the VCO 61 through 65 indicated by the arrows A through D in FIG. 2.

As illustrated in FIG. 5, an oscillation node 211A of the VCO 211 is connected to a terminal (left edge in FIG. 5) of the wirings 230A via the GM element 212, and the GM element 213 is feedback connected to the VCO 211 and the GM element 212. To a connection point 214 of the GM elements 212 and 213, the terminal of the wirings 230A is connected.

The GM element 212 includes a transconductance gmf, which converts clocks output from the oscillation node 211A of the VCO 211 into a current I1 (from voltage V1), and outputs the current I1.

The GM element 213 includes a transconductance (-gmb), which converts the voltage at the connection point 214 into a current I2, and feeds back the current I2 to the VCO 211.

An oscillation node 221A of the VCO 221 is connected to another terminal (right edge in FIG. 5) of the wirings 230A via the GM element 222, and the GM element 223 is feedback connected to the VCO 221 and the GM element 222. To a connection point 224 of the GM elements 222 and 223, the other terminal of the wirings 230A is connected.

The GM element 222 includes a transconductance (-gmf), and converts clocks output from the oscillation node 221A of the VCO 221 into the current I3 (from voltage V3), and outputs the current I3.

The GM element 223 includes a transconductance gmb, and converts the voltage at the connection point 224 into a current I4, and feeds back the current I4 to the VCO 221.

The wirings 230A have the terminal (left edge in FIG. 5) connected to the connection point 214 of the GM elements 212 and 213, and the other terminal (right edge in FIG. 5) connected to the connection point 224 of the GM elements 222 and 223. The wirings 230A are constituted by wirings of a semiconductor integrated circuit.

The wirings 230A have a parasitic capacitance similar to the wirings 130 of the clock distributor 100 according to the first embodiment.

As described above, the GM elements 212, 213, 222, 223 are symmetrically connected with respect to the wirings 230A.

The transconductance of the GM element 212 and the transconductance of the GM element 222 have opposite phases, and therefore at the wirings 230A, a voltage according to the difference (I1-I3) in the output current of the GM elements 212 and 222 is generated. In the clock distributor 200 according to the second embodiment, by making the GM elements 212 and 222 have a transconductance of opposite phases and connecting these elements with the wirings 230A, subtraction between the output current I1 of the GM element 212 and the output current I3 of the GM element 222 is implemented.

Therefore, the GM elements 213 and 223 respectively convert the voltage according to the difference into currents I2 and I4, and feed back these currents to the VCO 211, 221. The GM elements 213 and 223 both convert the voltage according to the difference into a current, and therefore the current values of the currents I2 and I4 are equal.

Therefore, it is possible to feed back equal currents to the VCO 211 and 221. This is realized according to the symmetry of the above circuit.

Furthermore, an oscillation node 221A of the VCO 221 is connected to a terminal (left edge in FIG. 5) of the wirings 230B via the GM element 232, and the GM element 233 is feedback connected to the VCO 221 and the GM element 232. To a connection point 234 of the GM elements 232 and 233, the terminal of the wirings 230B is connected.

The GM element 232 includes a transconductance gmf, which converts clocks output from the oscillation node 221A of the VCO 221 into a current I5 (from voltage V3), and outputs the current I5.

The GM element 233 includes a transconductance (-gmb), which converts the voltage at the connection point 234 into a current I6, and feeds back the current I6 to the VCO 221.

An oscillation node 231A of the VCO 231 is connected to another terminal (right edge in FIG. 5) of the wirings 230B via the GM element 242, and the GM element 243 is feedback connected to the VCO 231 and the GM element 242. To a connection point 244 of the GM elements 242 and 243, the other terminal of the wirings 230B is connected.

The GM element 242 includes a transconductance (-gmf), and converts clocks output from the oscillation node 231A of the VCO 231 into the current I7 (from voltage V5), and outputs the current I7.

The GM element 243 includes a transconductance gmb, and converts the voltage at the connection point 244 into a current I8, and feeds back the current I8 to the VCO 231.

The wirings 230B have the terminal (left edge in FIG. 5) connected to the connection point 234 of the GM elements 232 and 233, and the other terminal (right edge in FIG. 5) connected to the connection point 244 of the GM elements 242 and 243. The wirings 230B are constituted by wirings of a semiconductor integrated circuit.

The wirings 230B have a parasitic capacitance similar to the wirings 130 of the clock distributor 100 according to the first embodiment.

As described above, the GM elements 232, 233, 242, 243 are symmetrically connected with respect to the wirings 230B.

The transconductance of the GM element 232 and the transconductance of the GM element 242 have opposite phases, and therefore at the wirings 230B, a voltage according to the difference (I5-I7) in the output current of the GM elements 232 and 242 is generated. In the clock distributor 200 according to the second embodiment, by making the GM elements 232 and 242 have a transconductance of opposite phases and connecting these elements with the wirings 230B, subtraction between the output current I5 of the GM element 232 and the output current I7 of the GM element 242 is implemented.

Therefore, the GM elements 233 and 243 respectively convert the voltage according to the difference into currents I6 and I8, and feed back these currents to the VCO 221, 231. The GM elements 233 and 243 both convert the voltage according to the difference into a current, and therefore the current values of the currents I6 and I8 are equal.

Therefore, it is possible to feed back equal currents to the VCO 221 and 231. This is realized according to the symmetry of the above circuit.

Furthermore, an oscillation node 231A of the VCO 231 is connected to a terminal (right edge in FIG. 5) of the wirings 230C via the GM element 252, and the GM element 253 is feedback connected to the VCO 231 and the GM element 252. To a connection point 254 of the GM elements 252 and 253, the terminal of the wirings 230C is connected.

The GM element 252 includes a transconductance gmf, which converts clocks output from the oscillation node 231A of the VCO 231 into a current I9 (from voltage V5), and outputs the current I9.

The GM element 253 includes a transconductance (-gmb), which converts the voltage at the connection point 254 into a current I10, and feeds back the current I10 to the VCO 231.

An oscillation node 211A of the VCO 211 is connected to another terminal (left edge in FIG. 5) of the wirings 230C via the GM element 262, and the GM element 263 is feedback connected to the VCO 211 and the GM element 262. To a connection point 264 of the GM elements 262 and 263, the other terminal of the wirings 230C is connected.

The GM element 262 includes a transconductance (-gmf), and converts clocks output from the oscillation node 211A of the VCO 211 into the current I11 (from voltage V1), and outputs the current I11.

The GM element 263 includes a transconductance gmb, and converts the voltage at the connection point 264 into a current I12, and feeds back the current I12 to the VCO 211.

The wirings 230C have the terminal (right edge in FIG. 5) connected to the connection point 254 of the GM elements 252 and 253, and the other terminal (left edge in FIG. 5) connected to the connection point 264 of the GM elements 262 and 263. The wirings 230C are constituted by wirings of a semiconductor integrated circuit.

The wirings 230C have a parasitic capacitance similar to the wirings 130 of the clock distributor 100 according to the first embodiment.

As described above, the GM elements 252, 253, 262, 263 are symmetrically connected with respect to the wirings 230C.

The transconductance of the GM element 252 and the transconductance of the GM element 262 have opposite phases, and therefore at the wirings 230C, a voltage according to the difference (I9-I11) in the output current of the GM elements 252 and 262 is generated. In the clock distributor 200 according to the second embodiment, by making the GM elements 252 and 262 have a transconductance of opposite phases and connecting these elements with the wirings 230C, subtraction between the output current I9 of the GM element 252 and the output current of the GM element 262 is implemented.

Therefore, the GM elements 253 and 263 respectively convert the voltage according to the distance into currents I10 and I12, and feed back these currents to the VCO 231, 211. The GM elements 253 and 263 both convert the voltage according to the difference into a current, and therefore the current values of the currents I10 and I12 are equal.

Therefore, it is possible to feed back equal currents to the VCO 231 and 211. This is realized according to the symmetry of the above circuit.

As described above, the clock distributor 200 according to the second embodiment illustrated in FIG. 5, according to the symmetry of the circuit, the currents (I2+I12, I4+I6, I8+I10) fed back to the VCO 211, 221, 231 are equal.

Thus, in the clock distributor 200, by locking the VCO 231 by inputting the phase adjustment signals fcnt in the adjustment signal input terminal 201 from the LPF of the synchronization circuit, equal currents are fed back to the VCO 211, 221, 231, and mutual injection locking is performed at the VCO 211, 221, 231. Therefore, the frequencies of the clocks OCK 21, OCK 12, OCK 13 respectively oscillated by the VCO 211, 221, 231 are equal.

In FIG. 5, the three VCO 211, 221, 231 are connected to each other in a loop.

The three VCO 211, 221, 231 are examples of plural oscillators, and among these, the VCO 231 constitutes a PLL together with the synchronization circuit.

The VCO 211 and the GM elements 212, 213, 262, 263 constitute a single unit circuit part. The GM elements 212, 213, 262, 263 are examples of first through fourth voltage current converting elements. The connection point 214 of the GM elements 212 and 213 is an example of a first connection part, and the connection point 264 of the GM elements 262 and 263 is an example of a second connection part.

Similarly, the VCO 221 and the GM elements 222, 223, 232, 233 constitute a single unit circuit part. The GM elements 232, 233, 222, 223 are examples of first through fourth voltage current converting elements. The connection point 234 of the GM elements 232 and 233 is an example of a first connection part, and the connection point 224 of the GM elements 222 and 223 is an example of a second connection part.

Similarly, the VCO 231 and the GM elements 242, 243, 252, 253 constitute a single unit circuit part. The GM elements 252, 253, 242, 243 are examples of first through fourth voltage current converting elements. The connection point 254 of the GM elements 252 and 253 is an example of a first connection part, and the connection point 244 of the GM elements 242 and 243 is an example of a second connection part.

The wirings 230A, 230B, 230C, which respectively connect the connection parts 214, 234, 254 as the first connection part and the connection parts 224, 244, 264 as the second connection part, are examples of wiring parts.

As described above, the clock distributor 200 illustrated in FIG. 5 includes three unit circuit parts, and the three unit circuit parts are connected in a loop by the wirings 230A, 230B, 230C.

Next, with reference to FIG. 6, a detailed description of the circuit of the clock distributor 200 according to the second embodiment is given below.

Figure 6:
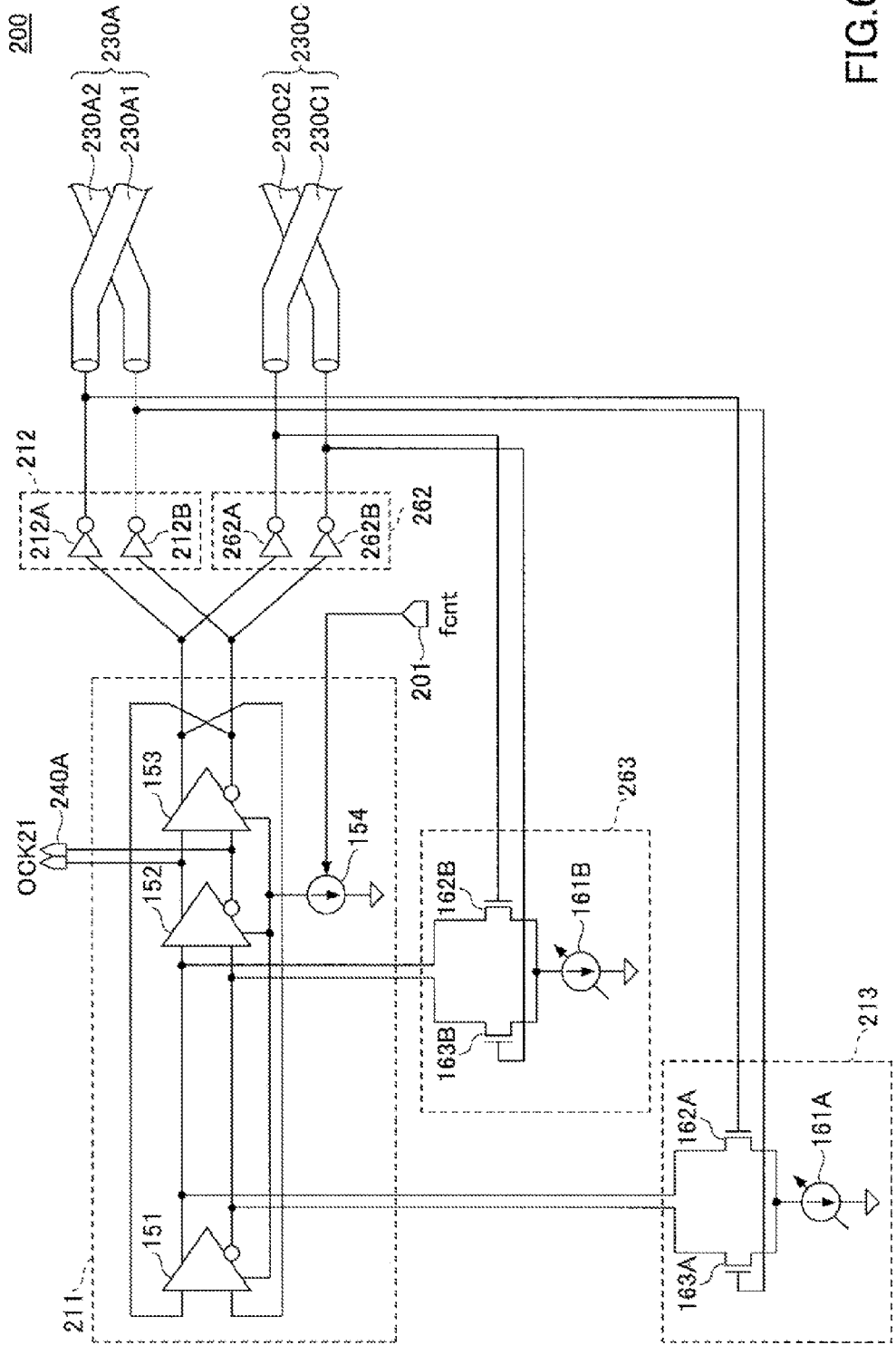
FIG. 6 illustrates a circuit configuration of the clock distributor according to the second embodiment.

FIG. 6 illustrates a circuit configuration of the clock distributor 200 according to the second embodiment. As a matter of convenience, among the elements included in the clock distributor 200 according to the second embodiment, only the VCO 211 and elements connected to the VCO 211 are illustrated. According to the symmetry (see FIG. 5) of the circuit configuration of the clock distributor 200, the circuit configurations of the VCO 221, 231 and elements around the VCO 221, 231 are the same as those illustrated in FIG. 6. Furthermore, in FIG. 6, it is assumed that the VCO 211 outputs differential clocks.

The VCO 211 includes three stages of inverters 151, 152, and 153 and an electric current source 154. The inverters 151, 152, and 153 are current starved type inverters, and constitute a ring oscillator. The VCO 111 is one type of a ring oscillator.

That is to say, the inverters 151, 152, and 153 are connected in series, and the non-inverting output terminal of the inverter 153 is connected to the inverting output terminal of the inverter 151 (bottom input terminal in FIG. 6). Furthermore, the inverting output terminal of the inverter 153 is connected to the non-inverting output terminal of the inverter 151 (top input terminal in FIG. 6).

For example, the inverters 151, 152, and 153 are implemented by CMOS (Complementary Metal Oxide Semiconductor).

The oscillation frequency of the VCO 211 is controlled by adjusting the output current value of the electric current source 154 with phase adjustment signals fcnt input to the phase adjustment signal input terminal 201.

The clocks OCK 21 output from the VCO 211 may be acquired from any of the output terminals of the inverters 151, 152, and 153 constituting the ring oscillator. In FIG. 6, as one example, the output from the inverter 152 is acquired as the output of the VCO 211. From the output terminal 240A, the differential type clocks OCK 21 are output.

The input destination of the current I2 fed back from the GM element 213 may be any of the input terminals of the inverters 151, 152, and 153 constituting the ring oscillator. In FIG. 6, the current I2 is input to the input terminal of the inverter 152.

The GM element 212 may be an element that performs current conversion on the output of the VCO 211. In FIG. 6, inverters 212A and 212B are used. The inverters 212A and 212B both have a transconductance of gmf.

The output terminal of the inverter 212A is connected to the GM element 213, and is connected to the GM element 222 via wirings 230A1 included in the wirings 230A. To the inverter 212A, the non-inverting output terminal of the inverter 153 of the VCO 211 is connected.

The output terminal of the inverter 212B is connected to the GM element 213, and is connected to the GM element 222 via wirings 230A2 included in the wirings 230A. To the inverter 212B, the inverting output terminal of the inverter 153 of the VCO 211 is connected.

The GM element 213 includes an electric current source 161A and two NMOS (N-type Metal Oxide Semiconductor) transistors 162A, 163A.

The electric current source 161A has one terminal (top terminal in FIG. 6) connected to the sources of the NMOS transistors 162A, 163A, and another terminal (bottom terminal in FIG. 6) connected to ground.

The NMOS transistor 162A has a source connected to the source of the NMOS transistor 163A and the electric current source 161A. The NMOS transistor 162A has a drain connected between the non-inverting output terminal of the inverter 151 and the non-inverting output terminal of the inverter 152.

The NMOS transistor 163A has a source connected to the source of the NMOS transistor 162A and the electric current source 161A. The NMOS transistor 163A has a drain connected between the inverting output terminal of the inverter 151 and the inverting output terminal of the inverter 152.

The GM element 262 may be an element that performs current conversion on the output of the VCO 211. In FIG. 6, inverters 262A and 262B are used. The inverters 262A and 262B both have a transconductance of (-gmf).

The output terminal of the inverter 262A is connected to the GM element 263, and is connected to the GM element 252 via wirings 230C1 included in the wirings 230C. To the inverter 262A, the non-inverting output terminal of the inverter 153 of the VCO 211 is connected.

The output terminal of the inverter 262B is connected to the GM element 263, and is connected to the GM element 252 via wirings 230C2 included in the wirings 230C. To the inverter 262B, the inverting output terminal of the inverter 153 of the VCO 211 is connected.

The GM element 263 includes an electric current source 161B and two NMOS (N-type Metal Oxide Semiconductor) transistors 162B, 163B.

The electric current source 161B has one terminal (top terminal in FIG. 6) connected to the sources of the NMOS transistors 162B, 163B, and another terminal (bottom terminal in FIG. 6) connected to ground.

The NMOS transistor 162B has a source connected to the source of the NMOS transistor 163B and the electric current source 161B. The NMOS transistor 162B has a drain connected between the non-inverting output terminal of the inverter 151 and the non-inverting output terminal of the inverter 152.

The NMOS transistor 163B has a source connected to the source of the NMOS transistor 162B and the electric current source 161B. The NMOS transistor 163B has a drain connected between the inverting output terminal of the inverter 151 and the inverting output terminal of the inverter 152.

In FIG. 6, among the elements included in the clock distributor 200 according to the second embodiment, only the VCO 211 and a circuit connected to the VCO 211 are illustrated. The VCO 221 and 231, and a circuit connected to the VCO 221 and 231 have the same configuration as described above.

Similar to the clock distributor 100 according to the first embodiment, in the clock distributor 200 according to the second embodiment, at the wirings 230A, there is generated a voltage corresponding to a differential signal between an output signal of the oscillation node 211A of the VCO 211 and an output signal of the oscillation node 221A of the VCO 221.

Furthermore, at the wirings 230B, there is generated a voltage corresponding to a differential signal between an output signal of the oscillation node 211A of the VCO 211 and an output signal of the oscillation node 231A of the VCO 231. Furthermore, at the wirings 230C, there is generated a voltage corresponding to a differential signal between an output signal of the oscillation node 231A of the VCO 231 and an output signal of the oscillation node 211A of the VCO 211.

Phase adjustment signals fcnt are input from the LPF of the synchronization circuit to the phase adjustment signal input terminal 201 to lock the VCO 232. Accordingly, it is possible to feed back equal electric currents to the VCO 211, 221, 231, and mutual injection locking is performed at the VCO 211, 221, 231. Accordingly, the frequencies of the clocks OCK 21, the clocks OCK 22, and the clocks OCK 23 respectively oscillated by the VCO 211, 221, 231 become equal.

According to the second embodiment, the oscillation nodes of the VCO are not directly connected to each other as in the conventional technology. Instead, the VCO 211 and the VCO 221 are combined so as to obtain a differential signal between an output signal of the oscillation node 211A of the VCO 211 and an output signal of the oscillation node 221A of the VCO 221, via the GM elements 212, 222 and the wirings 230A.

That is to say, by making the GM elements 212 and 222 have a transconductance of opposite phases and connecting these elements with the wirings 230A, subtraction between the output current I1 of the GM element 212 and the output current I3 of the GM element 222 is implemented.

Furthermore, the current obtained by the subtraction (a current expressing a differential signal between an output signal of the oscillation node 211A of the VCO 211 and an output signal of the oscillation node 221A of the VCO 221) is fed back to the VCO 211 and the VCO 221.

Similarly, the VCO 221 and the VCO 231 are combined so as to obtain a differential signal between an output signal of the oscillation node 221A of the VCO 221 and an output signal of the oscillation node 231A of the VCO 231, via the GM elements 232, 242 and the wirings 230B.

Furthermore, the current obtained by the subtraction (a current expressing a differential signal between an output signal of the oscillation node 221A of the VCO 221 and an output signal of the oscillation node 231A of the VCO 231) is fed back to the VCO 221 and the VCO 231.

Similarly, the VCO 231 and the VCO 211 are combined so as to obtain a differential signal between an output signal of the oscillation node 231A of the VCO 231 and an output signal of the oscillation node 211A of the VCO 211, via the GM elements 252, 262 and the wirings 230C.

Furthermore, the current obtained by the subtraction (a current expressing a differential signal between an output signal of the oscillation node 231A of the VCO 231 and an output signal of the oscillation node 211A of the VCO 211) is fed back to the VCO 231 and the VCO 211.

Therefore, similar to the clock distributor 100 according to the first embodiment, the load of the oscillation nodes 211A, 221A, 231A of the VCO 211, 221, 231 is prevented from increasing as in the conventional technology, and oscillation by mutual injection locking is implemented at a higher frequency compared to the conventional technology.

Furthermore, the VCO 211, 221, 231 oscillate at the same frequency by mutual injection locking as described above, and therefore the skew of the clocks OCK 21, the clocks OCK 22, and the clocks OCK 23 is reduced. Thus, the clock distributor 200 distributes the clocks OCK 21 and the clocks OCK 22 with a reduced skew, from the VCO 231 included in the PLL.

Figure 7A:
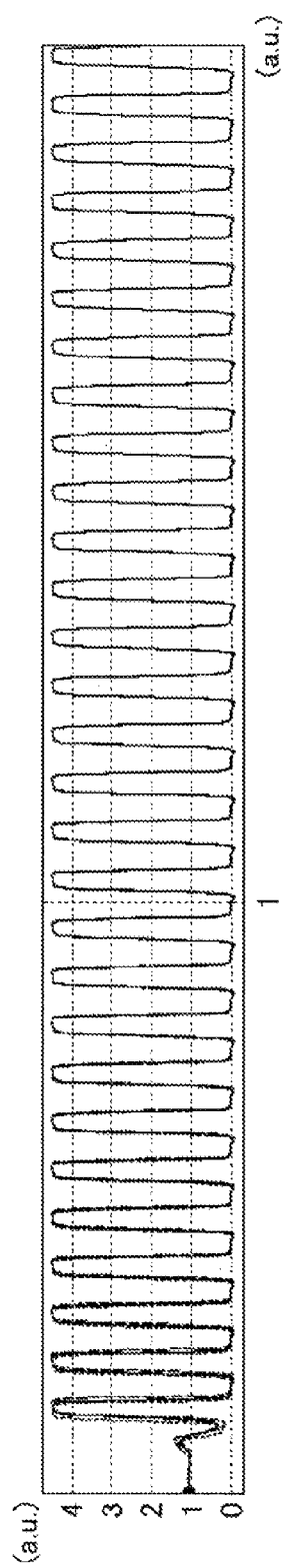
FIGS. 7A and 7B illustrate wave forms of clocks OCK 21, clocks OCK 22, and clocks OCK 23 by the clock distributor according to the second embodiment.
Figure 7B:
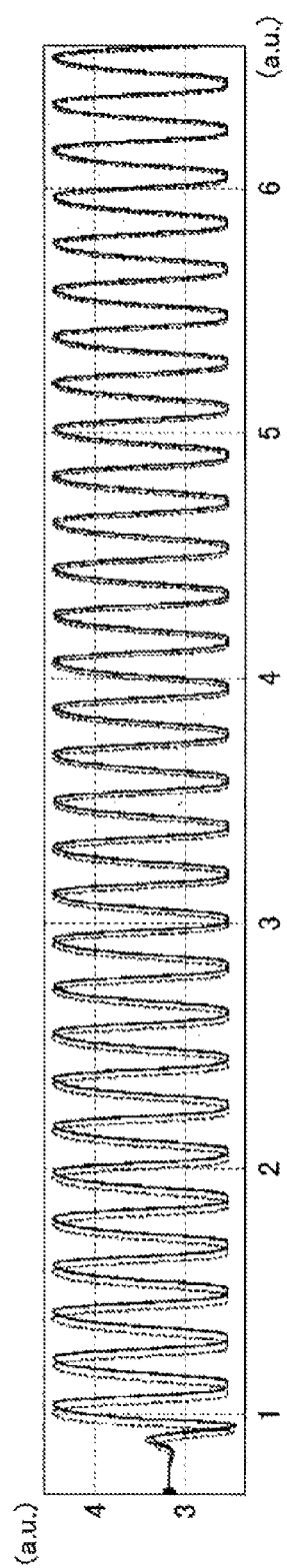

With reference to FIGS. 7A and 7B, a description is given of waveforms of the clocks OCK 21, the clocks OCK 22, and the clocks OCK 23 of the clock distributor 200 according to the second embodiment.

FIGS. 7A and 7B illustrate waveforms of the clocks OCK 21, the clocks OCK 22, and the clocks OCK 23 of the clock distributor 200 according to the second embodiment.

FIGS. 7A and 7B indicate the clocks OCK 21, the clocks OCK 22, and the clocks OCK 23 in a case where the current values of the electric current sources 154 of the VCO 211, 221, 231 are adjusted, to oscillate the clock distributor 200 in two types of frequencies of the GHz order. In FIGS. 7A and 7B, the horizontal axis is the time axis and the vertical axis expresses the voltage value of the clocks.

As illustrated in FIGS. 7A and 7B, on the left edge of the time axis, there is a displacement in the frequency of the clocks OCK 21, the clocks OCK 22, and the clocks OCK 23. Toward the right edge of the time axis, the frequencies of the clocks OCK 21, the clocks OCK 22, and the clocks OCK 23 become equal.

Furthermore, toward the right edge of the time axis, the skew is reduced.

In FIGS. 7A and 7B, among the clocks OCK 21, the clocks OCK 22, and the clocks OCK 23, the clocks OCK 23 are displaced at the left edge of the time axis.

As described above, according to the second embodiment, oscillation by mutual injection locking is implemented at a higher frequency compared to the conventional technology, and oscillation at the GHz order is possible.

Furthermore, the VCO 211, 221, 231 oscillate at the same frequency by mutual injection locking, and therefore the skew of the clocks OCK 21, the clocks OCK 22, and the clocks OCK 23 is reduced.

In the above description, the clock distributor 200 includes three unit circuit parts; however, the number of unit circuit parts is not limited to three, as long as there are greater than or equal to two unit circuit parts.

Third Embodiment

Figure 8:
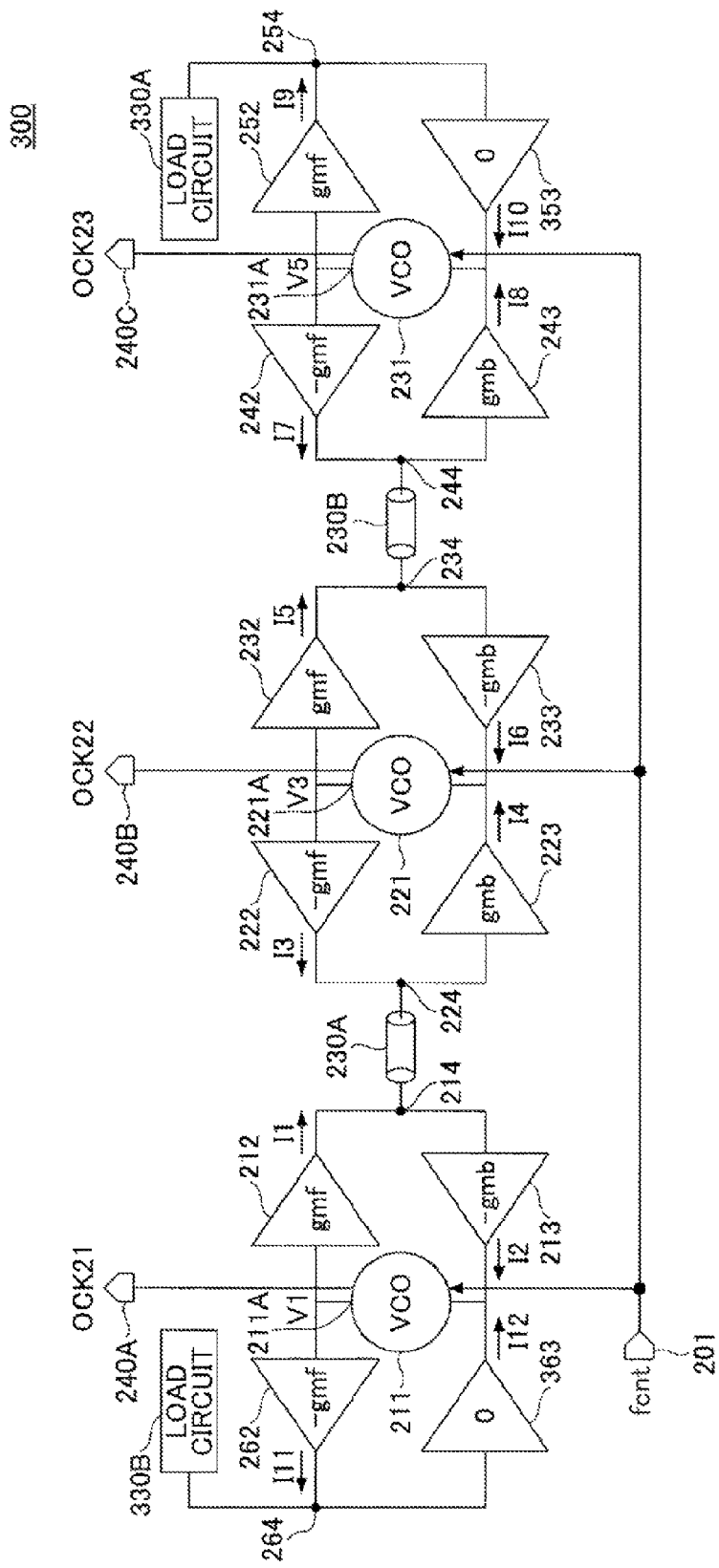
FIG. 8 illustrates a clock distributor according to a third embodiment.

FIG. 8 illustrates a clock distributor 300 according to a third embodiment.

The clock distributor 300 includes a phase adjustment signal input terminal 201, VCO 211, 221, 231, GM elements 212, 213, 222, 223, 232, 233, 242, 243, 252, 262, 353, 363, wirings 230A, 230B, output terminals 240A, 240B, 240C, and load circuits 330A, 330B.

The clock distributor 300 according to the third embodiment includes the load circuits 330A, 330B instead of the wirings 230C of the second embodiment, and includes the GM elements 353, 363 instead of the GM elements 253, 263 of the second embodiment.

Other configurations are the same as those of the clock distributor 200 according to the second embodiment, and therefore the same elements are denoted by the same reference numerals and are not further described.

The load circuit 330A is connected to the connection point 254 of the GM elements 252 and 253, and for example, a capacitive element equal to the parasitic capacitance of the wirings 230A, 230B may be used. The load circuit 330A has the connection point 254 terminated.

The load circuit 330B is connected to the connection point 264 of the GM elements 262, 363, and similar to the load circuit 330A, a capacitive element equal to the parasitic capacitance of the wirings 230A, 230B may be used. The load circuit 330B has the connection point 264 terminated.

The GM elements 353, 363 are formed by making the electric current sources 161A, 161B (see FIG. 6) have the current values of zero.

That is to say, the current flowing in the GM elements 353, 363 is the same as that of the GM elements 253, 263 of the second embodiment.

The clock distributor 300 according to the third embodiment includes three unit circuit parts. Among the three unit circuit parts of FIG. 8, the unit circuit parts on either side are terminated by the load circuits 330A, 330B.

Thus, in the clock distributor 300 according to the third embodiment, the three unit circuit parts are connected in series.

In the clock distributor 300 illustrated in FIG. 8, phase adjustment signals fcnt are input from the LPF of the synchronization circuit to the phase adjustment signal input terminal 201 to lock the VCO 231. Accordingly, it is possible to feed back equal electric currents to the VCO 211 and the VCO 221, and mutual injection locking is performed at the VCO 211, 221, 231. Accordingly, the frequencies of the clocks OCK 21, the clocks OCK 22, and the clocks OCK 23 respectively oscillated by the VCO 211, 221, 231 become equal.

AS described above, in the clock distributor 300 according to the third embodiment, similar to the clock distributor 200 according to the third embodiment, the VCO 211, 221, 231 oscillate at the same frequency by mutual injection locking.

In FIG. 8, three unit circuit parts are connected in series. However, the number of unit circuit parts may be increased. Four or more unit circuit parts may be connected in series so that mutual injection locking is performed at the VCO included in the respective unit circuit parts, and oscillation is performed at the same frequency. For example, if the number of unit circuit parts is five, it is possible to realize the clock distributor included in the transmitter circuit 50 illustrated in FIG. 2.

According to an aspect of the embodiments, a clock distributor and an electronic device capable of performing oscillation at high frequency are provided.

The clock distributor and the electronic device according to the first to third embodiments of the present invention are described above. The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock distributor comprising:
a plurality of unit circuit parts, each of the plurality of unit circuit parts including,
an oscillator,
a first voltage current converting element configured to convert output voltage of the oscillator into a current,
a second voltage current converting element having a voltage current conversion characteristic of an opposite phase to that of the first voltage current converting element, the second voltage current converting element being feedback connected to the first voltage current converting element and the oscillator,
a third voltage current converting element configured to convert output voltage of the oscillator into a current, and
a fourth voltage current converting element having a voltage current conversion characteristic of an opposite phase to that of the third voltage current converting element, the fourth voltage current converting element being feedback connected to the third voltage current converting element and the oscillator;
a wiring part configured to connect a first connection part of the first voltage current converting element and the second voltage current converting element of a first unit circuit part of the plurality of unit circuit parts to a second connection part of the third voltage current converting element and the fourth voltage current converting element of a second unit circuit part of the plurality of unit circuit parts; and
a synchronization circuit connected to the oscillator of the first unit circuit part or the second unit circuit part of the plurality of unit circuit parts,
wherein a voltage which occurs at the wiring part in accordance with a difference between a first output current of the first voltage current converting element of the first unit circuit part and a second output current of the third voltage current converting element of the second unit circuit part is converted into a third output current and a fourth output current by the second voltage current converting element of the first unit circuit part and the fourth voltage current converting element of the second unit circuit part, respectively, and
wherein the third output current and the fourth output current are fed back to the oscillator of the first unit circuit part and the oscillator of the second unit circuit part, respectively.

2. The clock distributor according to claim 1, wherein the first voltage current converting element and the third voltage current converting element are inverters.

3. The clock distributor according to claim 1, wherein the oscillator is configured to control an oscillation frequency by current control or voltage control.

4. The clock distributor according to claim 1, wherein the plurality of unit circuit parts are connected in a loop.

5. The clock distributor according to claim 1, wherein the plurality of unit circuit parts are connected in series, and
a transconductance of the second voltage current converting element of one of the plurality of unit circuit parts positioned at one end and a transconductance of the fourth voltage current converting element of another one of the plurality of unit circuit parts positioned at another end are zero.

6. The clock distributor according to claim 5, wherein a capacitive load is connected to the first connection part of the one of the plurality of unit circuit parts positioned at the one end and the second connection part of the one of the plurality of unit circuit parts positioned at the another end.

7. An electronic device comprising:
the clock distributor according to claim 1; and
a circuit configured to operate in accordance with clocks output from the clock distributor.

8. The clock distributor according to claim 1, wherein each of the oscillator of the first unit circuit part and the oscillator of the second unit circuit part includes a plurality of inverters that constitutes a ring oscillator.

9. The clock distributor according to claim 8, wherein the plurality of inverters are current starved type inverters, respectively.

10. The clock distributor according to claim 1, wherein the synchronization circuit and one of the oscillator of the first unit circuit part and the second unit circuit part that is connected to the synchronization circuit constitute a Phase Locked Loop (PLL) circuit.

11. A clock distributor comprising:
a first oscillator;
a first voltage current converting element configured to convert output voltage of the first oscillator into a current;
a second voltage current converting element having a voltage current conversion characteristic of an opposite phase to that of the first voltage current converting element, the second voltage current converting element being feedback connected to the first voltage current converting element and the first oscillator;
a second oscillator;
a third voltage current converting element configured to convert output voltage of the second oscillator into a current;
a fourth voltage current converting element having a voltage current conversion characteristic of an opposite phase to that of the third voltage current converting element, the fourth voltage current converting element being feedback connected to the third voltage current converting element and the second oscillator;
a wiring part configured to connect a first connection part of the first voltage current converting element and the second voltage current converting element to a second connection part of the third voltage current converting element and the fourth voltage current converting element; and
a synchronization circuit connected to the first oscillator or the second oscillator,
wherein a voltage which occurs at the wiring part in accordance with a difference between a first output current of the first voltage current converting element and a second output current of the third voltage current converting element is converted into a third output current and a fourth output current by the second voltage current converting element and the fourth voltage current converting element, respectively, and
wherein the third output current and the fourth output current are fed back to the first oscillator and the second oscillator, respectively.

12. An electronic device comprising:
the clock distributor according to claim 11; and
a circuit configured to operate in accordance with clocks output from the clock distributor.

13. The clock distributor according to claim 11, wherein each of the first oscillator and the second oscillator includes a plurality of inverters that constitutes a ring oscillator.

14. The clock distributor according to claim 13, wherein the plurality of inverters are current starved type inverters, respectively.

15. The clock distributor according to claim 11, wherein the synchronization circuit and one of the first oscillator and the second oscillator that is connected to the synchronization circuit constitute a Phase Locked Loop (PLL) circuit.

* * * * *